(12) United States Patent
Yang et al.

(10) Patent No.: US 7,186,587 B2
(45) Date of Patent: Mar. 6, 2007

(54) SINGULATION METHOD USED IN IMAGE SENSOR PACKAGING PROCESS AND SUPPORT FOR USE THEREIN

(75) Inventors: JunYoung Yang, Paju-Si (KR); InHo Kim, Paju-Si (KR)

(73) Assignee: Advanced Semiconductor Engineering, Taipei (TW)

( * ) Notice: Subject to any disclaimer, the term of this patent is extended or adjusted under 35 U.S.C. 154(b) by 233 days.

(21) Appl. No.: 10/944,197

(22) Filed: Sep. 20, 2004

(65) Prior Publication Data

US 2006/0063357 A1   Mar. 23, 2006

(51) Int. Cl.
   *H01L 21/50*   (2006.01)
   *H01L 21/48*   (2006.01)
   *H01L 21/44*   (2006.01)

(52) U.S. Cl. .................. 438/110; 438/113; 438/115; 438/116

(58) Field of Classification Search .............. None
See application file for complete search history.

(56) References Cited

U.S. PATENT DOCUMENTS

| | | | |
|---|---|---|---|
| 6,345,903 B1 * | 2/2002 | Koike et al. ............... | 362/249 |
| 6,476,417 B2 * | 11/2002 | Honda et al. ............... | 257/59 |
| 6,479,320 B1 * | 11/2002 | Gooch ........................ | 438/109 |
| 6,808,960 B2 * | 10/2004 | Yamamoto ................... | 438/107 |
| 6,900,072 B2 * | 5/2005 | Patel et al. ................ | 438/106 |
| 6,939,784 B2 * | 9/2005 | Chen et al. ................ | 438/456 |
| 7,005,310 B2 * | 2/2006 | Hanada et al. .............. | 438/25 |
| 7,061,106 B2 * | 6/2006 | Yang et al. ................. | 257/723 |
| 7,091,058 B2 * | 8/2006 | Wu et al. .................... | 438/57 |

* cited by examiner

*Primary Examiner*—Zandra V. Smith
*Assistant Examiner*—Khanh Duong
(74) *Attorney, Agent, or Firm*—Pillsbury Winthrop Shaw Pittman LLP

(57) ABSTRACT

A singulation method used in a process for making a plurality of image sensor packages is disclosed. Firstly, a semi-finished product including a plurality of package structures formed on a substrate is placed on a support having a plurality of cavities for receiving the package structures. Then, the semi-finished product is sawed into separate image sensor packages. During the sawing step, the air pressure in the cavities is decreased to create suction within the cavities such that the support abuts against at least a portion of the housing of each package structure with a gap between the transparent component and the support whereby the package structures are positioned precisely and clamped in place with the support during the sawing step.

12 Claims, 2 Drawing Sheets

SINGULATION METHOD USED IN IMAGE SENSOR PACKAGING PROCESS AND SUPPORT FOR USE THEREIN

BACKGROUND OF THE INVENTION

1. Field of the Invention

This invention relates to a process for making image sensor packages and more specifically to a singulation method used in the image sensor packaging process.

2. Description of the Related Art

Image sensors are increasingly in demand for incorporation into electronic devices. They may be used for a variety of applications including consumer electronics like digital cameras, cellular telephones and hand-held scanners.

In order to protect the image sensors in the form of an integrated circuit die, i.e., the image sensor chip, from physical damage and from contaminants in the surrounding environment, it is the practice to place the image sensor chip in a package. The package typically includes an opening sealed by a transparent lid to allow light or other forms of electromagnetic radiation to pass through to sensing circuitry on the active surface of the image sensor chip. Another purpose of the package is to provide electrical communication with other components of the larger electronic device into which they are incorporated.

The image sensor chips are typically packaged into an array of many individual units on a substrate to meet large-scale production requirements. Then, a punching operation is conducted to separate out the individual units. However, such a punching operation requires a substrate having a low-density unit designs which significantly increases the manufacturing cost because the substrate accounts for up to 60% of the total assembly cost. In addition, the biggest drawback of such a punching operation is that every different shape or size of packages requires a dedicated punching tool, e.g., if the shape or the size is altered, the punching tool must be redesigned. The development and manufacture of a punching tool typically takes about 3~4 months thereby significantly increasing assembly lead time. This is unacceptable since current image sensor packages have very short lifetimes (typically about 3~6 months).

SUMMARY OF THE INVENTION

It is therefore an object of the present invention to provide a singulation method used in a process for making a plurality of image sensor packages which overcomes or at least reduces the above-mentioned problems of the prior art.

In the image sensor packaging process for use with the present invention, a semi-finished product is formed by packaging a plurality of image sensor chips into an array of many package structures on a substrate. Each of the package structures comprises a housing in which the image sensor chip is disposed and a transparent component supported by the housing. The transparent component is provided to allow light or other forms of electromagnetic radiation to pass through the housing to the image sensor chip.

To achieve the above listed and other objects, a singulation method having features of the present invention is accomplished by a sawing operation instead of the punching operation mentioned above such that the substrate for use with the present invention can be designed to have units arranged at high density thereby significantly decreasing the manufacturing cost. In the singulation method of the present invention, the semi-finished product is placed on a support having a plurality of cavities such that the package structures are respectively received in the cavities of the support. Then, the semi-finished product is sawed into separate image sensor packages. During the sawing step, the package structures are positioned precisely and clamped in place with the support whereby the dimension change of finished image sensor packages can be controlled within a desired range, e.g., ±0.1 mm. Specifically, the package structures may be positioned precisely and clamped in place by a suction within the cavities created by decreasing the air pressure in the cavities. Alternatively, the suction may be created by decreasing the air pressure in a plurality of first slots provided between the cavities of the support. Note that the support for use with the present invention is configured to have a gap between the transparent component and the support when the support abuts against at least a portion of the housing of each package structure during the sawing step. Such kind of support design can protect the transparent component from damage of the support when the package structures are clamped by the support.

Note that the development and manufacture of a support for use with the present invention usually takes much less time than the development and manufacture of a punching tool. Therefore, assembly lead time can be significantly shortened by using the singulation method of the present invention.

Conventional sawing processes typically involve the use of water to wash away sawing debris. However, the water may contaminate the transparent component, which adversely affects the function of the image sensor. To avoid obstructing or distorting the electromagnetic radiation which passes through the transparent component and then strikes the active area of the image sensor chip, the singulation method of the present invention uses vacuum suction, air guns or blowers instead of water to remove the sawing debris. The vacuum suction is accomplished by decreasing the air pressure in a plurality of second slots provided between the cavities of the support at locations facing the cutting streets of the substrate when the package structures are received in the cavities.

BRIEF DESCRIPTION OF THE DRAWINGS

These and other features, aspects, and advantages of the present invention will be more fully understood by reading the following detailed description of the preferred embodiment, with reference made to the accompanying drawings as follows.

DETAILED DESCRIPTION OF THE PREFERRED EMBODIMENT

The present invention is directed to a singulation method used in a process for making a plurality of image sensor packages. In the image sensor packaging process for use with the present invention, a semi-finished product (see FIG. 1) is formed by packaging a plurality of image sensor chips 112 (see FIG. 2) into an array of package structures 110 on a substrate 120, e.g., a liquid crystal polymer (LCP) substrate, a thermoplastic substrate, an alumina-based ceramic substrate, a printed circuit board, a plastic glass laminated substrate, or a tape-based substrate.

Figure 1:
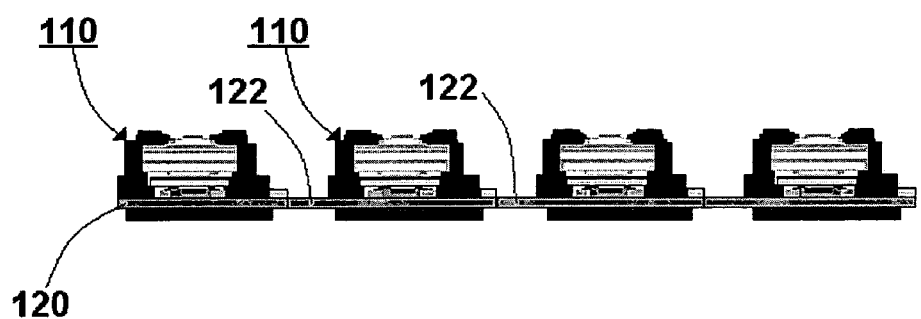
FIG. 1 is a cross sectional view of a semi-finished product formed in a image sensor packaging process for use with the present invention.
Figure 2:
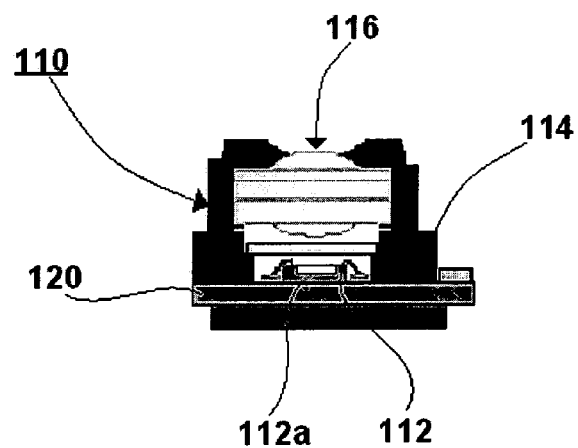
FIG. 2 is a cross sectional view of a finished image sensor package according to one embodiment of the present invention.

As shown in FIG. 1, the package structures 110 are arranged in strip type configuration and separated from each other by a plurality of cutting streets 122. However, the package structures 110 may be arranged in rows and columns, e.g., a 4×4 matrix or a 4×8 matrix, which is more appropriate for mass production. When an matrix type arrangement is adopted, the cutting streets generally form an orthogonal grid on the substrate. As best shown in FIG. 2, each image sensor chip 112 is attached to the substrate 120 by means of an adhesive layer such as a silver-filled epoxy (not shown) and is electrically connected to the substrate 120 through a plurality of bonding wires such as gold wires. Each package structure 110 is provided with a housing 114 mounted around the image sensor chip 112 and to the substrate 120. Preferably, the housing 114 provides a hermetic like seal around the image sensor chip 112. A transparent component 115 is supported by the housing 114. As best shown in FIG. 2, the transparent component 115 includes lenses for focusing incident light on the active area 112a which was responsive to electromagnetic radiation of the chip 112. However, the transparent component for use with the present invention may provide another optical function such as filtering selected wavelengths of light or represent a partially optically transparent plastic lid or glass lid to allow light or other forms of electromagnetic radiation to pass through to the chip. Preferably, a molding process is performed to form the housing 114. Referring to FIG. 1, the package structures 110 are formed on the upper surface of the substrate 120 and the semi-finished product may comprises a plurality of micro-controllers or digital signal processing (DSP) chips (not shown) attached and electrically coupled to the lower surface of the substrate 120 at locations opposite to the image sensor chips 112 (see FIG. 2).

Figure 3:
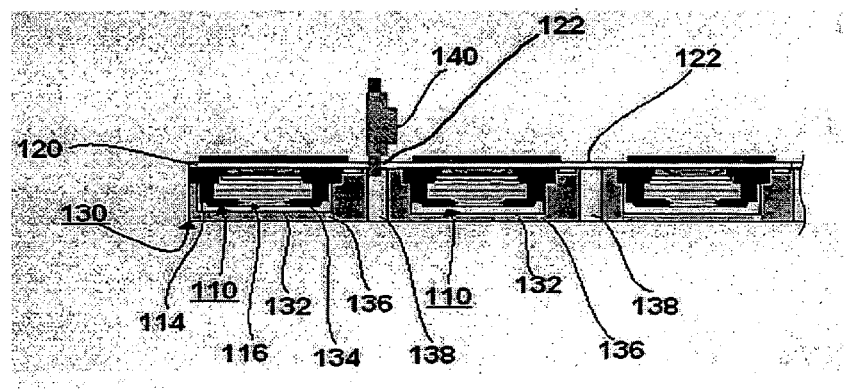
FIG. 3 illustrates a singulation method used in the image sensor packaging process according to one embodiment of the present invention.

FIG. 3 illustrates a singulation method used in the image sensor packaging process according to one embodiment of the present invention. As shown, the semi-finished product of FIG. 1 is inverted and then placed on a support 130. The support 130 has a plurality of cavities 132 respectively configured for receiving the package structures 110. The cavities 132 are connected to a vacuum source (not shown) such as a vacuum pump or suction pump through channels 136 provided in the support 130. After the semi-finished product of FIG. 1 is placed on the support 130, the air pressure in the cavities 132 is decreased relative to ambient by the vacuum source to create suction within the cavities. Then, a sawing tool 140 such as a high speed steel sawing tool or a solid carbide sawing tool is used to cut the semi-finished product into separate units along the cutting streets 122 in order to obtain the finished image sensor packages (best shown in FIG. 2). During the sawing operation, the package structures 110 are positioned precisely and clamped in place by the suction created within the cavities 110 of the support 130 whereby the dimension change of finished image sensor packages can be controlled within a desired range, e.g., ±0.1 mm.

As shown in FIG. 3, the support 130 is configured to have a gap 134 between the transparent component 116 and the support 130 when the support 130 abuts against a portion of the housing 114 of each package structure 110 due to the suction created within the cavities 134. Such kind of support design can protect the transparent component 116 from damage of the support 130 when the package structures are clamped by the support 130.

Note that the singulation method mentioned above is accomplished by a sawing operation instead of the conventional punching operation such that the substrate for use with the present invention can be designed to have units arranged at high density thereby significantly increasing the package density of image senor chips on a given substrate area, which in turn can lower the manufacturing cost.

Figure 4:
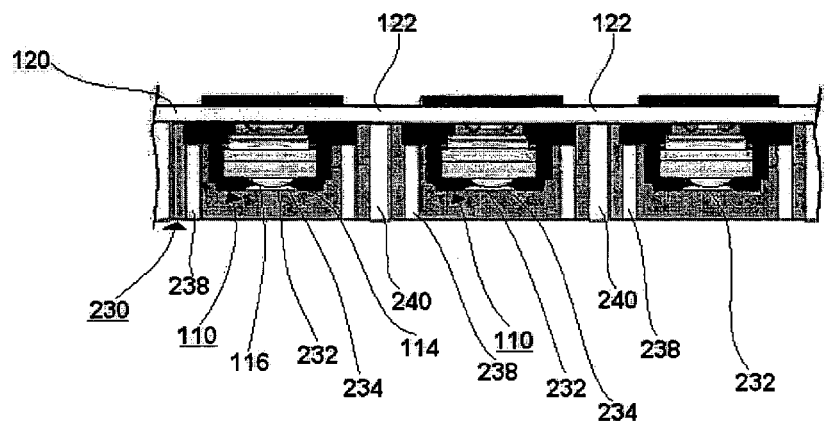
FIG. 4 illustrates a singulation method used in the image sensor packaging process according to another embodiment of the present invention.

FIG. 4 illustrates a singulation method used in the image sensor packaging process according to another embodiment of the present invention. As shown, the support 230 has a plurality of cavities 232 for receiving the package structures 110 and a plurality of slots 238 connected to a vacuum source (not shown) such as a vacuum pump or suction pump. After the semi-finished product of FIG. 1 is placed on the support 230, the air pressure in the slots 238 is decreased relative to ambient by the vacuum source to create suction within the cavities. Then, the semi-finished product is sawed into separate units. During the sawing operation, the package structures 110 are positioned precisely and clamped in place by the suction created within the slots 238 of the support 230 whereby the dimension change of finished image sensor packages can be controlled within a desired range, e.g., ±0.1 mm.

It is worth mentioning that conventional sawing processes typically involve the use of water to wash away sawing debris. However, the water may contaminate the transparent component, which adversely affects the function of the image sensor. To avoid obstructing or distorting the electromagnetic radiation which passes through the transparent component and then strikes the active area of the image sensor chip, the embodiment shown in FIG. 3 and FIG. 4 utilizes vacuum suction instead of water to remove the sawing debris. As shown in FIG. 3, the support 130 is provided with a plurality of slots 138 between the cavities 132. The slots 138 are connected to a debris removal system having a vacuum source (note shown) that operates during the sawing process to decrease the air pressure in the slots 138 relative to ambient. When the package structures 110 are received in the cavities 132, the slots 138 face the cutting streets 112 of the substrate 120 such that the sawing debris can be sucked into a debris collection sink (note shown) provided in the debris removal system through the slots 138. The support 230 shown in FIG. 4 is also provided with a plurality of slots 240 for removing the sawing debris. However, the slots 138 and 240 are not an essential aspect of the present invention, since the sawing debris may be removed by air guns or blowers after or during the sawing operation.

Note that the development and manufacture of a support for use with the present invention usually takes much less time than the development and manufacture of a punching tool. Therefore, assembly lead time can be significantly shortened by using the singulation method of the present invention.

Although the invention has been explained in relation to its preferred embodiments, it is to be understood that many other possible modifications and variations can be made without departing from the spirit and scope of the invention as hereinafter claimed. For example, while described primarily in terms of an image sensor package, it is to be understood that the singulation method of the present invention may be used in processes for packaging various other optically interactive electronic devices which require a transparent component provided in their package structure.

The term "optically interactive" as used herein is meant to encompass devices sensitive to various wavelengths of light or other forms of radiation, including, but not limited to, CCD and CMOS image sensors, and photodiodes, as well as light-emitting devices including semiconductor lasers and light-emitting diodes.

What is claimed is:

1. A singulation method used in a process for making a plurality of image sensor packages, the singulation method comprising the following steps:
   providing a semi-finished product including a plurality of package structures formed on a substrate, wherein each of the package structures comprises a housing formed on the substrate, an image sensor chip disposed within the housing and electrically coupled to the substrate, and a transparent component supported by the housing;
   placing the semi-finished product on a support having a plurality of cavities such that the package structures are respectively received in the cavities of the support; and
   simultaneously sawing the semi-finished product into separate image sensor packages and decreasing the air pressure in the cavities to create suction within the cavities such that the support abuts against at least a portion of the housing of each package structure with a gap between the transparent component and the support.

2. The method as claimed in claim 1, wherein:
   the substrate has a plurality of sawing streets between the package structures,
   the support has a plurality of slots between the cavities,
   the cutting streets of the substrate faces the slots of the support when the semi-finished product is placed on the support,
   the semi-finished product are sawed into separate image sensor packages along the sawing streets, and
   the method further comprises a step of decreasing the air pressure in the slots to remove sawing debris during the sawing step.

3. The method as claimed in claim 1, further comprising a step of removing sawing debris during the sawing step by an air gun or a blower.

4. The method as claimed in claim 1, wherein the cavities of the support are arranged in rows and columns.

5. The method as claimed in claim 1, wherein the sawing step is conducted by a high speed steel sawing tool or a solid carbide sawing tool.

6. The method as claimed in claim 1, wherein the substrate is selected from a group consisting of a liquid crystal polymer (LCP) substrate, a thermoplastic substrate, an alumina-based ceramic substrate, a printed circuit board, a plastic glass laminated substrate, and a tape-based substrate.

7. A singulation method used in a process for making a plurality of image sensor packages, the singulation method comprising the following steps:
   providing a semi-finished product including a plurality of package structures formed on a substrate, wherein each of the package structures comprises a housing formed on the substrate, an image sensor chip disposed within the housing and electrically coupled to the substrate, and a transparent component supported by the housing;
   providing a support having a plurality of cavities and a plurality of first slots between the cavities;
   placing the semi-finished product on the support such that the package structures are respectively received in the cavities of the support;
   simultaneously sawing the semi-finished product into separate image sensor packages and decreasing the air pressure in the first slots to create suction within the first slots such that the support abuts against at least a portion of the housing of each package structure with a gap between the transparent component and the support whereby the package structures are positioned precisely and clamped in place with the support during the sawing step.

8. The method as claimed in claim 7, wherein:
   the substrate has a plurality of sawing streets between the package structures,
   the support has a plurality of second slots between the cavities,
   the cutting streets of the substrate faces the second slots of the support when the semi-finished product is placed on the support,
   the semi-finished product are sawed into separate image sensor packages along the sawing streets, and
   the method further comprises a step of decreasing the air pressure in the second slots to remove sawing debris during the sawing step.

9. The method as claimed in claim 7, further comprising a step of removing sawing debris during the sawing step by an air gun or a blower.

10. The method as claimed in claim 7, wherein the cavities of the support are arranged in rows and columns.

11. The method as claimed in claim 7, wherein the sawing step is conducted by a high speed steel sawing tool or a solid carbide sawing tool.

12. The method as claimed in claim 7, wherein the substrate is selected from a group consisting of a liquid crystal polymer (LCP) substrate, a thermoplastic substrate, an alumina-based ceramic substrate, a printed circuit board, a plastic glass laminated substrate, and a tape-based substrate.

* * * * *